United States Patent [19]

Murphy et al.

[11] Patent Number: 5,478,435
[45] Date of Patent: Dec. 26, 1995

[54] POINT OF USE SLURRY DISPENSING SYSTEM

[75] Inventors: James J. Murphy; Janos Farkas; Lucia C. Markert; Rahul Jairath, all of Austin, Tex.

[73] Assignees: National Semiconductor Corp., Santa Clara, Calif.; Sematech Inc., Austin, Tex.; AT&T GIS, Dayton, Ohio

[21] Appl. No.: 356,987

[22] Filed: Dec. 16, 1994

[51] Int. Cl.$^6$ .................................................. H01L 71/00
[52] U.S. Cl. ..................... 156/636.1; 156/639.1; 156/345
[58] Field of Search ............... 156/636.1, 637.1, 156/657.1, 662.1, 345, 639.1, 645.1; 437/225; 51/281 R, 317

[56] References Cited

U.S. PATENT DOCUMENTS 3,979,239  9/1976  Walsh .................................. 156/636.1
4,021,278  5/1977  Hood et al. ...................... 156/636.1 X

*Primary Examiner*—William Powell
*Attorney, Agent, or Firm*—William W. Kidd

[57] ABSTRACT

A point of use slurry dispensing system with controls for dilution, temperature and oxidizer/etchant/additive infusion. A slurry in unmixed form and a diluting agent are independently pumped to a pad on a CMP tool. Liquid heaters are used to heat the slurry and the diluting agent to a desirable temperature. The actual mixing occurs at the point of use on the pad or in a dispensing line just prior to the point of use. In some instances a third independent distribution line is used to dispense an oxidizer, etchant and/or chemical additive at or near the point of use.

16 Claims, 2 Drawing Sheets

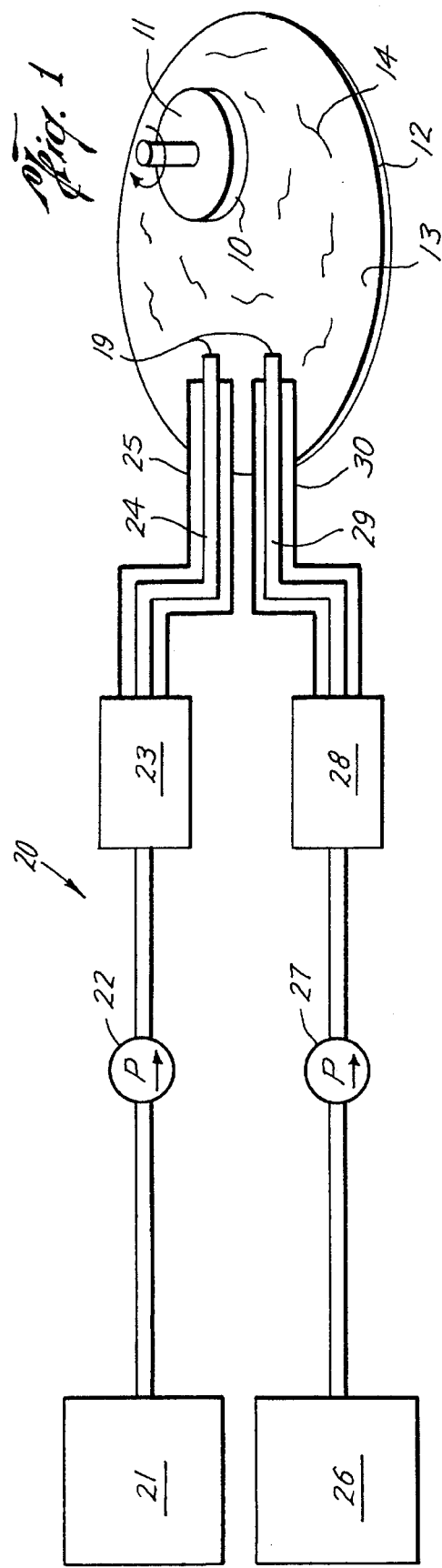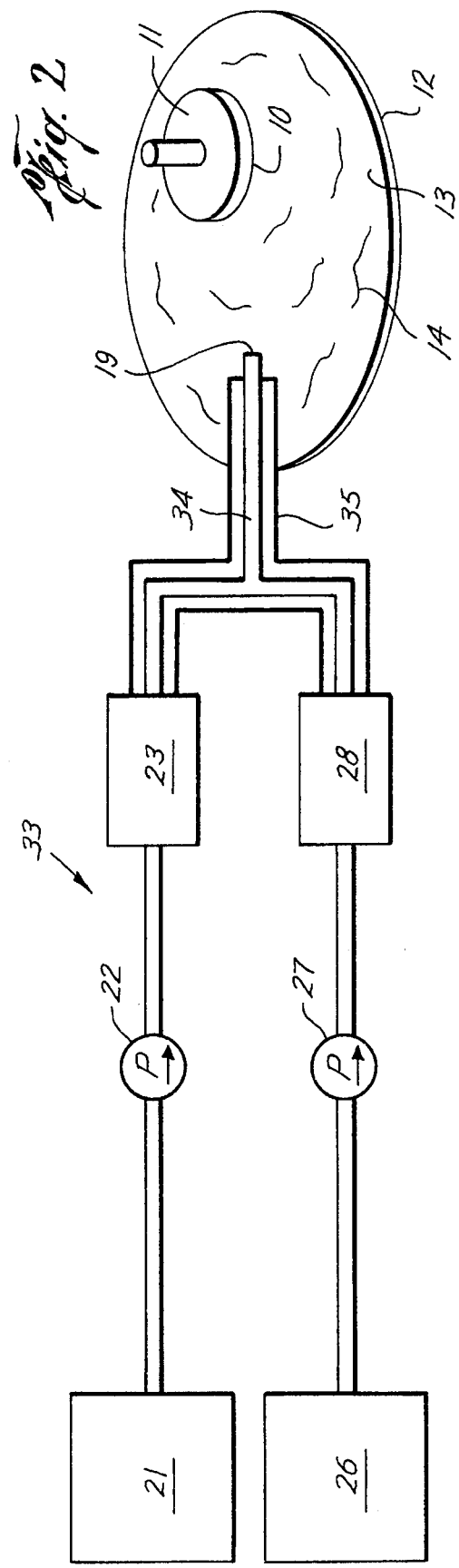

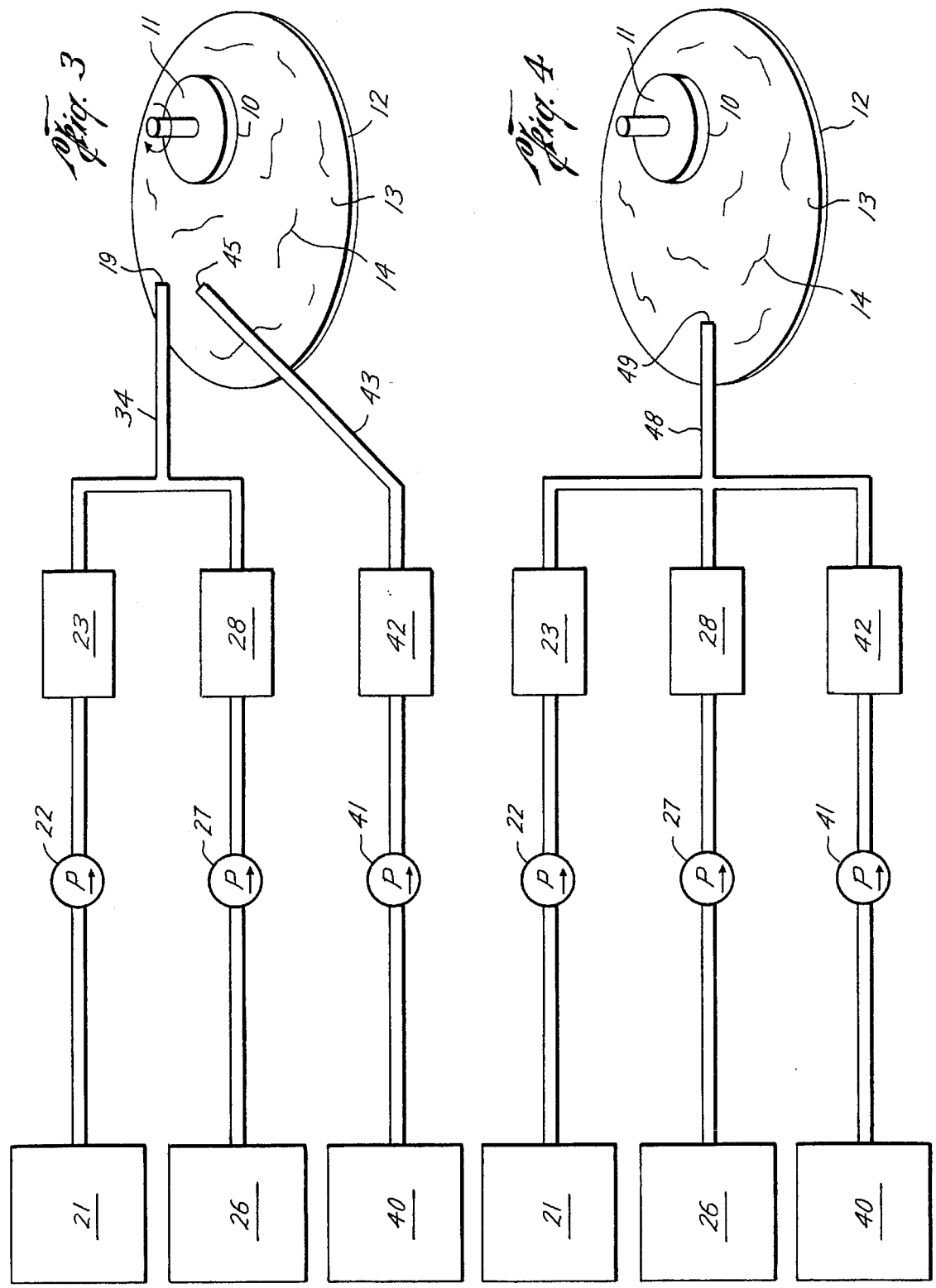

POINT OF USE SLURRY DISPENSING SYSTEM

BACKGROUND OF THE INVENTION

1. Field of the Invention

The present invention relates to the field of semiconductor manufacturing techniques and, more particularly, to a technique for dispensing slurry for polishing wafers.

2. Prior Art

The art abounds with references pertaining to techniques for polishing a surface. Various semiconductor polishing techniques today can be traced back to the polishing methods employed to polish optical lenses. Similar techniques have been utilized in the semiconductor field to polish wafers, which are used for manufacturing integrated circuit devices. Thus, a number of methods are known in the prior art for polishing wafers.

The manufacture of an integrated circuit device requires the formation of various layers (both conductive and non-conductive) above the base substrate to form the necessary components and interconnects. During the manufacturing process, removal of a certain layer or portions of a layer must be achieved in order to pattern and form various components and interconnects. Generally, this removal process is termed "etching."

One of the techniques available for removing material is the chemical-mechanical polishing (CMP) process in which a chemical slurry is used along with a polishing pad. The mechanical movement of the pad relative to the wafer provides the abrasive force for removing the exposed surface of the wafer. A variety of CMP tools are available to perform this type of polishing. Improvements are currently being sought in the areas of pad design, chemical compositions of the slurry and forces exerted on the wafer by the pad, all to obtain better control over existing CMP practices. However, one area lacking consideration is the area pertaining to the storage, mixing and transport of slurry to the pad for use on the tool.

The current practice entails premixing of a slurry in relatively large quantities (1 to 15+ gallons) prior to use. Generally, bulk slurry is taken from storage in large quantities and premixed to a desired concentration. The mixing will depend on the type of use for the slurry. For example, in performing CMP on oxides, generally, slurries are diluted to desired concentration, typically by the use of de-ionized water. In performing CMP on metals, oxidizers and/or etchants are generally used to control the chemical component of the polishing process. Dilution by the use of de-ionized water can also be practiced.

Furthermore, additives can be introduced as well, for both oxide and metal polishing, if required. These additives are utilized to enhance removal rate, uniformity, selectivity, etc. Then the slurry is heated, if necessary, and retained in a container for transport to the pad. This results in variable heat loss during distribution to systems located in different environments or at varying distances. The technology is further complicated by a potentially short lifetime of the slurry after addition of chemical oxidizer, etchant and/or additive. Additional risks are encountered if either the slurry or oxidizer/etchant/additive (or the combination of slurry and oxidizer/etchant/additive) experiences degradation at elevated temperatures or over prolonged period of time.

Also, to change concentration of the dilution or chemicals, usually the entire system must be purged and the mixture disposed of and remixed at the desired concentrations. In some instances, concentration levels will change due to evaporation of the diluting agent, such as water. This constant remixing of the chemicals can be a significant cost burden in manufacturing.

Therefore, it is appreciated that a novel technique for providing slurry distribution in order to reduce waste and improve control over the slurry is desirable. The present invention addresses these needs.

SUMMARY OF THE INVENTION

A point of use slurry dispensing system with controls for dilution, temperature and oxidizer/etchant/additive infusion is described. A slurry in unmixed form is pumped to a pad on a CMP tool by a liquid pump. A liquid heater is used to heat the slurry to a desirable temperature. A liquid dispensing line from the heater to the pad where the slurry is dispensed is encased in a line heater to maintain the temperature of the slurry at the desired level. The liquid heater is located proximal to the tool so that the dispensing line is made short as possible or practical. The slurry is dispensed onto the polishing pad in its original form.

A second dispensing line similar to the first is utilized to distribute a diluting agent, such as de-ionized water, to the pad as well. The diluting agent is dispensed onto the pad at the dispensing point of the slurry. The mixing of the slurry and the diluting agent occurs at the point of use on the pad. Flow control is maintained by the liquid pump of the second line so that the amount of diluting agent flow determines the concentration level of the slurry when mixed. In an alternative embodiment, the two liquids are mixed in the dispensing line just prior to the point of use.

In another embodiment, a third independent distribution line is utilized to dispense oxidizer/etchant/additive chemical(s) at the point of use or in the dispensing line just prior to the point of use. By mixing the slurry with the diluting agent and/or the oxidizer/etchant/additive at the point of use, mixing of the liquids occurs just prior to use. Furthermore, improved dilution, temperature and chemical infusion controls are achieved.

BRIEF DESCRIPTION OF THE DRAWINGS

FIG. 1 is an illustration of a CMP tool utilizing a slurry dispensing system of the present invention in which two separate liquid delivery lines mixes two liquids at the point of use.

FIG. 2 is an illustration of a CMP tool utilizing a slurry dispensing system of the present invention in which two separate liquid delivery lines mixes two liquids in a dispensing line just prior to the point of use.

FIG. 3 is an illustration of a CMP tool utilizing a slurry dispensing system of FIG. 2, but with an additional liquid delivery line for delivering an additional chemical for mixing at the point of use.

FIG. 4 is an illustration of a CMP tool utilizing a slurry dispensing system of FIG. 2, but with an additional liquid delivery line for delivering an additional chemical for mixing with the other two liquids in a dispensing line just prior to the point of use.

DETAILED DESCRIPTION OF THE PREFERRED EMBODIMENTS

The present invention describes a point of use slurry dispensing system with controls for dilution, temperature and chemical infusion. In the following description, numerous specific details are set forth, such as specific devices, temperatures, chemicals, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention. Additionally, it is to be noted that the description refers to the dispensing of a slurry onto a pad, simply because the drawings illustrate a wafer residing above a pad. However, if a tool incorporates a design in which the pad resides above the wafer, then it is understood that the slurry is dispensed onto the wafer.

The technique described herein is referred to as a point of use slurry dispensing system. Although a novel apparatus can be designed to incorporate the method of the present invention, it is appreciated that a variety of prior art polishing equipment can be readily adapted to implement the method of the present invention as well. Once the technique described herein is disclosed, those ordinarily skilled in the art can readily implement the method in a variety of ways. Furthermore, the preferred embodiment is described in reference to polishing semiconductor wafers, especially silicon wafers, utilizing a chemical-mechanical polishing (CMP) process, but the invention need not be limited only to wafers or to CMP.

Referring to FIG. 1, a setup of a tool for performing polishing is shown. An item to be polished, such as a silicon wafer 10, is supported by a carrier 11 and placed face-down on polish platen 12 so that a surface which is to be polished rests against the polish platen 12. Typically, a polishing pad 13 forms or resides on the surface of the platen 12 upon which the wafer surface resides. It is to be appreciated that the polishing device of FIG. 1 can be utilized for polishing a variety of objects other than semiconductors. However, the preferred embodiment is for the purpose of polishing semiconductor wafers. More specifically, a silicon wafer is polished by the use of a CMP process.

In most CMP applications, the carrier 11 is rotated in order to rotate the wafer 10. Usually, the polishing pad 13 is also rotated as well. Furthermore, the carrier 11 can be made to traverse across the surface of pad 13 in order to prevent the wafer 10 from being stationary over one area of the pad 13 during use. It is to be noted that the carrier 10, pad 13, or both, can be made to move horizontally. This practice allows for relative horizontal movement of the carrier 11 in relation to pad 13, so that the wafer 10 moves across the surface of pad 13 during use. Alternatively, the carrier 11 and wafer 10 can be made stationary over an area of pad 13. What is important is that there be mechanical force (usually, a rotating force) applied to the surface of the wafer being polished.

In general usage, CMP requires the use of a chemical slurry 14 in order to achieve the desired polishing of the wafer. The slurry 14 is generally made to flow across the surface of the pad 13 in order to have the slurry form a hydrodynamic layer between the wafer 10 and pad 13. There are a variety of slurries for use in CMP applications to polish semiconductor wafers and these slurries (and their use) are well known in the prior art. The use of oxidizers, etchants and/or chemical additives to enhance the polishing process or to obtain desired planarization of the surface is also known in the prior art. Thus, the practice of CMP utilizing items 10–14 in FIG. 1 is known in the prior art and is described here as one example of performing CMP on an object, which in this instance is a semiconductor wafer 10. Additionally, although FIG. 1 shows the wafer 10 above the pad 13, it is generally understood that the two can be reversed. In that instance, the pad 13 will be located above the wafer 10.

As shown in FIG. 1, a novel aspect of the present invention is in the dispensing of the slurry 14 onto platen 12 (or pad 13) by a dispensing system 20. A concentrated liquid slurry obtained from a bulk slurry supply is introduced into a holding container 21. A pump 22 is coupled to container 21 by a liquid flow line for pumping the liquid slurry from container 21. Pump 22 is utilized for the purpose of controlling the flow rate of the concentrated slurry being drawn from container 21. The output from pump 22 is coupled to a liquid heater 23. Heater 23 is utilized to heat the flowing slurry to a desirable temperature required for the dispensed slurry. Although a variety of liquid heating devices can be used, the preferred approach is a tank type heater capable of maintaining temperature of a small volume of liquid (100–1000 ml) from 70° F.–212° F.

A dispensing line (or tube) 24 is then coupled from heater 23 to transport the slurry to a location proximal to platen 12. The open end of dispensing line 24 is noted as a dispensing point 19 for dispensing the slurry 14 onto platen 12. The dispensing point is made proximal to the surface of the pad 13 that does not interfere with the movement of pad 13 or carrier 11. The intent is to place the dispensing point of the slurry as close as possible (or practical) to platen 12. In some instances, a line heater 25 is used to encase dispensing line 24. The purpose of the line heater is to prevent any heat loss from the slurry after the slurry leaves liquid heater 23.

It is to be noted that either or both of the heaters 23 and 25 can be used. Furthermore, if the desirable temperature of the slurry is at or near room temperature, then heaters 23 and 25 would not be needed (assuming that the slurry in the container is also at room temperature). It should also be noted that (although not shown) heaters 23 and 25, along with pump 22, are typically coupled to a monitor and control system for monitoring the flow rate and slurry temperature. If an automated monitor and control system is utilized, the flow rate and temperature of the slurry can be controlled by a processor. Monitoring of these parameters during operation of the CMP equipment will allow immediate feedback and automated response to correct for any deviations in the set parameters for the slurry.

Also shown in FIG. 1 is another liquid container 26, pump 27, liquid heater 28, dispensing line 29 and line heater 30. These units 26–30 function equivalently to the above-described units 21–25 to provide a duplicate dispensing system for dispensing another liquid onto platen 12. Typically, the liquid introduced into container 26 is a diluting agent, such as de-ionized (d.i.) water, which is used to control the concentration level of slurry 14 on platen 12. The dispensing point of line 29 is placed essentially at the dispensing point of line 24 so that the concentrated slurry from container 21 mixes with the diluting agent of container 26 at the dispensing point 19. Thus, the concentration level of the slurry 14 on platen 12 can be controlled by adjusting the flow rate of the diluting agent from line 29.

It is to be noted that the containers 21 and 26, pumps 22 and 27, and heaters 23 and 28 can be located at any distance from the platen 12. In some instances, these units may not need to reside in the actual CMP tool itself. However, it is preferred to have the heaters 23 and 28 proximal to platen 12 in order to reduce the line length of dispensing lines 24 and 29 to reduce heat loss from the liquids, especially if line heaters 25 and 30 are not used. It is preferred to locate heaters 23 and 28 so that the dispensing line from each heater to the dispensing point 19 is no more than 70 cm.

The dispensing system 20 of FIG. 1 is flexible in that each of the liquid dispensing line is independent of the other. Thus, liquid flow rates and temperature of the each liquid can be set at different levels and controlled separately. Additionally, if desired, other agents (such as oxidizers, etchants and/or chemical additives) can be introduced and combined with the liquids in container 21 and/or container 26.

It should also be noted that if the slurry and the diluting agent are to have the same dispensing temperature, then the dispensing lines 24 and 29 could be enclosed within a single line heater. That is only one line heater is needed for heaters 25 and 30. Likewise, as is shown in a dispensing system 33 of FIG. 2, the two liquids can be combined together prior to the dispensing this alternative embodiment shown in FIG. 2, the actual mixing of the two liquids is achieved after the liquid heaters 23 and 28, but before the dispensing point 19. A variety of techniques known in the prior art can be used for combining the two liquids in the dispensing line. One of the simplest approaches is to place a "T" connection at the mixing point.

Referring to FIG. 3, another alternative embodiment is shown. In FIG. 3, an additional liquid container 40, pump 41, liquid heater 42 and dispensing line 43 are shown. These units 40–43 are again a duplication of units 21–24 shown in FIGS. 1 and 2 and function in a similar manner. Instead of introducing an oxidizer, etchant and/or additive (hereinafter referred to as oxidizer/etchant/additive) in the slurry in container 21, the oxidizer/etchant/additive can be kept separate from the slurry until mixed at the point of use. Therefore, an oxidizer/etchant/additive is introduced into container 40 and transported to platen 12 by the dispensing tube 43. A dispensing point 45 for this liquid is disposed proximal to opening 19 for slurry. Thus, a fully independent flow and temperature control is available for the oxidizer/etchant/additive required by slurry 14.

It is to be noted that this third liquid feed is shown added to the system 33 of FIG. 2. However, it can be readily added to the system of FIG. 1 as well. Furthermore, line heaters are not shown in FIG. 3, but as described above, such line heaters can be utilized as well. It is also appreciated that another embodiment is to combine all three liquids prior to the dispensing point. For example, as is shown in FIG. 4, all three liquids can be combined in a dispensing tube 48, similar to the approach illustrated in FIG. 2. In this instance, the three liquids are combined prior to being ejected at a single dispense opening 49.

It is appreciated that many different design variations can be implemented to practice the present invention without departing from the spirit and scope of the present invention. For example, at the dispensing point (of either the single dispensing line embodiment or the multiple dispensing line embodiment), instead of dispensing directly onto the pad, a container can be used to collect the liquid(s) for further dispensing onto the pad. Furthermore, instead of using liquid heaters and line heaters prior to the dispensing point as shown in the Figures, this additional container can be heated to control the temperature of the slurry being dispensed.

Additionally, it is understood that the makeup of the various liquids described can be readily modified, including pre-diluting slurries, oxidizers, etchants and additives utilizing the technique of the present invention. For example, the oxidizer/etchant/additive can be diluted similar to the dilution scheme for slurries. In that instance, a diluting liquid container would be coupled to the oxidizer/etchant/additive line similar to the lines for containers 21 and 26 used for slurries.

An advantage of this invention over the prior art is in the ability to control any one or all of temperature, dilution and/or oxidizer/etchant/additive concentration at the point of dispense on the polishing pad. The actual mixing of the liquids can occur on the pad or in the dispensing line. Temperatures of the liquids can be controlled independently and maintained at temperature during use or during delays in application of the slurry. Time at temperature and mixing of the liquids can be delayed until the liquid is within centimeters of actual dispense onto the polishing pad. Thus, the mixing is achieved at or near the last possible moment before the slurry is used.

The present invention address concerns with the short shelf life of the chemicals after they are heated and mixed, or changes in concentration due to evaporation in a mixture. Variations in slurry concentration or chemicals can be generated at the point of use, which also lessens the amount of chemicals wasted. Thus, the practice of the present invention provides for substantial cost and time reduction in the use of slurries, as well as allowing for improved controls over the use of the slurry.

Thus, a point of use slurry dispensing system is described.

We claim:

1. A method of dispensing a liquid slurry for polishing a surface wherein said slurry is mixed with a second liquid at or proximal to said surface being polished, comprising the steps of:

pumping said slurry from a slurry container by use of a first pump in which flow rate of said slurry from said slurry container is controlled by said first pump;

pumping said second liquid from a liquid container by use of a second pump in which flow rate of said second liquid from said liquid container is controlled by said second pump;

distributing said slurry for dispensing for said polishing;

distributing said second liquid for mixing with said slurry at or proximate to a point of dispense of said slurry;

wherein said mixing of said slurry and said second liquid is achieved just prior to use of said slurry to polish said surface.

2. The method of claim 1 further including the step of heating said slurry after pumping said slurry from said slurry container but before distributing said slurry for dispensing; and the step of heating said second liquid after pumping said second liquid from said liquid container but before mixing with said slurry.

3. The method of claim 2 wherein said second liquid is a diluting agent such that said flow rate of said diluting agent determines concentration level of said slurry.

4. The method of claim 3 wherein said surface being polished is a semiconductor wafer surface.

5. The method of claim 4 wherein said slurry is used as a hydrodynamic layer to perform chemical-mechanical polishing on a silicon wafer.

6. A method of dispensing a liquid slurry to perform chemical-mechanical polishing wherein said slurry is mixed with a second liquid at or proximal to a surface being polished, comprising the steps of:

pumping said slurry from a slurry container by use of a first pump in which flow rate of said slurry from said slurry container is controlled by said first pump;

pumping said second liquid from a liquid container by use of a second pump in which flow rate of said second liquid from said liquid container is controlled by said second pump;

heating said slurry in a first liquid heater;

heating said second liquid in a second liquid heater;

distributing said slurry from said first liquid heater for dispensing to polish said surface;

distributing said second liquid for mixing with said slurry at or proximate to a point of dispense of said slurry;

wherein said mixing of said slurry and said second liquid is achieved just prior to use of said slurry to polish said surface and wherein temperature of said slurry and said second liquid are controlled by said first and second liquid heaters, respectively.

7. The method of claim 6 wherein said second liquid is a diluting agent such that said flow rate of said diluting agent determines concentration level of said slurry.

8. The method of claim 7 wherein said surface being polished is a semiconductor wafer surface.

9. The method of claim 7 further including the steps of pumping a third liquid from a third container by use of a third pump in which flow rate of said third liquid from said third container is controlled by said third pump;

heating said third liquid in a third liquid heater; and distributing said third liquid for mixing with said slurry at or proximate to a point of dispense of said slurry.

10. The method of claim 9 wherein said third liquid is an oxidizer, etchant or additive chemical for said slurry.

11. The method of claim 10 wherein said surface being polished is a semiconductor wafer surface.

12. In a polishing tool in which a liquid slurry is used between a polishing pad and a surface which is to be polished, an apparatus for dispensing said liquid slurry to perform polishing of said surface and wherein said slurry is mixed with a second liquid at or proximal to said surface being polished comprising:

a first pump for pumping said slurry from a slurry container holding said slurry;

a first heater coupled to said first pump for heating said slurry being pumped from said slurry container;

a first dispensing tube coupled to said first heater for distributing heated slurry for dispensing to polish said surface;

a second pump for pumping said second liquid from a liquid container holding said second liquid;

a second heater coupled to said second pump for heating said second liquid pumped from said liquid container;

a second dispensing tube coupled to said second heater for distributing heated second liquid for mixing with said heated slurry at or proximate to a point of dispense of said heated slurry;

wherein said mixing of said heated slurry and said heated second liquid is achieved just prior to use of said slurry to polish said surface and wherein temperature of said slurry and said second liquid are controlled by said first and second liquid heaters, respectively.

13. The apparatus of claim 12 wherein said second liquid is a diluting agent such that said flow rate of said diluting agent determines concentration level of said slurry.

14. The apparatus of claim 13 further including a third pump for pumping a third liquid from a third container holding said third liquid;

a third heater coupled to said third pump for heating said third liquid pumped from said third container;

a third dispensing tube coupled to said third heater for distributing heated third liquid for mixing with said heated slurry at or proximate to a point of dispense of said heated slurry.

15. The apparatus of claim 14 wherein said third liquid is an oxidizer, etchant or additive chemical for said slurry.

16. The apparatus of claim 15 wherein said surface is a semiconductor wafer surface.

\* \* \* \* \*

UNITED STATES PATENT AND TRADEMARK OFFICE
CERTIFICATE OF CORRECTION

PATENT NO : 5,478,435
DATED : December 26, 1995
INVENTOR(S): James J. Murphy, Janos Farkas, Lucia C. Markert, Rahul Jairath It is certified that error appears in the above-identified patent and that said Letters Patent is hereby corrected as shown below:

Column 5, line 19, after "dispensing" insert --point 10. In--.

Signed and Sealed this

Fifth Day of August, 1997

Attest:

Attesting Officer

BRUCE LEHMAN
Commissioner of Patents and Trademarks